US006968427B1

(12) United States Patent
Yee

(10) Patent No.: US 6,968,427 B1
(45) Date of Patent: Nov. 22, 2005

(54) BUILT-IN SELF TEST CIRCUIT FOR TESTING CACHE TAG ARRAY AND COMPARE LOGIC

(75) Inventor: Daniel E. Yee, Loveland, CO (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 318 days.

(21) Appl. No.: 10/308,913

(22) Filed: Dec. 2, 2002

(51) Int. Cl.[7] ........................ G06F 12/00; G06F 11/22
(52) U.S. Cl. .......................... 711/118; 711/154; 714/42
(58) Field of Search ...................... 714/42; 711/154, 711/118

(56) References Cited

U.S. PATENT DOCUMENTS

| | | | |
|---|---|---|---|
| 4,667,288 A * | 5/1987 | Keeley et al. ................. 714/25 |
| 5,553,082 A * | 9/1996 | Connor et al. ............... 714/733 |
| 5,613,087 A * | 3/1997 | Chin et al. ................... 711/154 |
| 5,638,382 A | 6/1997 | Krick et al. | |
| 5,640,509 A * | 6/1997 | Balmer et al. ................. 714/42 |
| 5,644,581 A * | 7/1997 | Wu ............................. 714/738 |
| 5,740,412 A | 4/1998 | Chan et al. | |
| 5,835,504 A | 11/1998 | Balkin et al. | |
| 6,101,578 A * | 8/2000 | Patwardhan et al. ......... 711/125 |
| 6,496,950 B1 * | 12/2002 | Zhao et al. ................... 714/718 |
| 6,640,293 B1 * | 10/2003 | Paredes et al. .............. 711/210 |
| 6,834,361 B2 * | 12/2004 | Abbott ......................... 714/42 |
| 6,836,865 B2 * | 12/2004 | Kusko et al. ................ 714/726 |
| 6,898,738 B2 * | 5/2005 | Ryan et al. .................... 714/42 |
| 2003/0061545 A1 * | 3/2003 | Patwardhan et al. .......... 714/42 |

* cited by examiner

Primary Examiner—Kevin Verbrugge

(57) ABSTRACT

A cache memory comprising: 1) a tag array comprising a plurality of tag entry locations that are accessed by R of the M least significant bits of an N-bit received address and stored an address tag comprising the (N-M) most significant bits of the N-bit received address. The cache memory also comprises 2) cache hit comparison circuitry for comparing the (N-M) most significant bits of an N-bit received address with an address tag and generating a HIT signal if a match occurs, and 3) tag array test circuitry for testing the operation of the tag array and the cache hit comparison circuitry.

15 Claims, 3 Drawing Sheets

BUILT-IN SELF TEST CIRCUIT FOR TESTING CACHE TAG ARRAY AND COMPARE LOGIC

TECHNICAL FIELD OF THE INVENTION

The present invention is generally directed to a cache memory and, in particular, to a BIST circuit for testing the tag array and comparator logic of a cache memory.

BACKGROUND OF THE INVENTION

The complexity of modern electronics, particularly data processors, has increased the likelihood of a manufacturing defect occurring in an integrated circuit (IC) chip. To increase the reliability of integrated circuits and to detect faulty ICs more rapidly, chip manufacturers commonly to incorporate built-in self-test (BIST) circuitry in many types of complex IC chips. BIST circuits are commonly used for memories, such as static random access memories (SRAM), dynamic random access memories (DRAM), flash RAM, and the like, and particularly cache memories. State-of-the-art chip level BIST circuitry uses a dedicated hardware controller to execute the BIST testing and to report the pass or fail result to an external device. BIST tests may be automatically generated for a given block of logic.

A BIST circuit for a cache memory typically performs some type of repetitive testing on the tag array of the cache memory. For example, a conventional BIST circuit may test one location in a tag array by "marching" Logic 1 values, Logic 0 values, and checkerboard patterns into the entry. In this type of testing, for example, Logic 1 values are shifted (i.e., "marched") into the tag array one bit position at a time until the entire location is filled with Logic 1 values. The contents of the tag array location are tested and verified after each Logic 1 is shifted in. This procedure is repeated for Logic 0 values and for a checkerboard pattern (i.e., alternating Logic 1 and Logic 0 values). After these tests are complete, the entire test cycle is repeated for each of the remaining tag array locations.

However, while the above-described testing procedure thoroughly tests the tag array logic, conventional BIST circuits for testing cache memories fail to adequately test the remaining portions of the cache memory. Most notably, the comparator logic that determines cache hits and cache misses is not tested by conventional BIST circuitry.

Therefore, there is a need in the art for improved BIST circuitry for testing the cache memories of data processors and other large-scale integrated circuit (IC) chips. In particular, there is a need for BIST circuitry that adequately tests the comparator logic circuitry of a cache memory.

SUMMARY OF THE INVENTION

To address the above-discussed deficiencies of the prior art, it is a primary object of the present invention to provide a cache memory containing a BIST circuit capable of testing the operation of the tag array comparator circuitry. According to an advantageous embodiment of the present invention, the cache memory comprising: 1) a tag array comprising a plurality of tag entry locations, each of the tag entry locations capable of being accessed by R of the M least significant bits of an N-bit received address and capable storing an address tag comprising the (N-M) most significant bits of the N-bit received address; 2) cache hit comparison circuitry capable of comparing the (N-M) most significant bits of an N-bit received address with an address tag accessed by R of the M least significant bits of the is N-bit received address and generating a HIT signal if a match occurs; and 3) tag array test circuitry capable of testing the operation of the tag array and the cache hit comparison circuitry.

According to one embodiment of the present invention, the tag array test circuitry is capable of storing a copy of the last data written to the tag array.

According to another embodiment of the present invention, the tag array test circuitry is capable of storing a copy of the last data read from the tag array.

According to still another embodiment of the present invention, the tag array test circuitry is capable of storing an address of a tag entry location to which data was last written.

According to yet another embodiment of the present invention, the tag array test circuitry is capable of determining if R of the M least significant bits of a current received address are equal to R of the M least significant bits of the stored address of the tag entry location to which data was last written.

According to a further embodiment of the present invention, the tag array test circuitry, in response to a determination that R of the M least significant bits of a current received address are equal to R of the M least significant bits of the stored address of the tag entry location to which data was last written, is further capable of comparing the stored copy of the last data written to the tag array with data retrieved from the tag array at the current received address.

According to a still further embodiment of the present invention, the tag array test circuitry compares the stored copy of the last data written to the tag array with the data retrieved from the tag array at the current received address by determining if the HIT signal is enabled.

According to a yet further embodiment of the present invention, the tag array test circuitry, in response to a determination that R of the M least significant bits of a current received address are equal to R of the M least significant bits of the stored address of the tag entry location to which data was last written, is further capable of comparing the stored copy of the last data read from the tag array at the current received address with current data read from the tag array at the current received address.

According to still another embodiment of the present invention, the tag array test circuitry compares the stored copy of the last data read from the tag array at the current received address with the current data read from the tag array at the current received address by determining if the HIT signal is enabled.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged cache memory.

Figure 1:
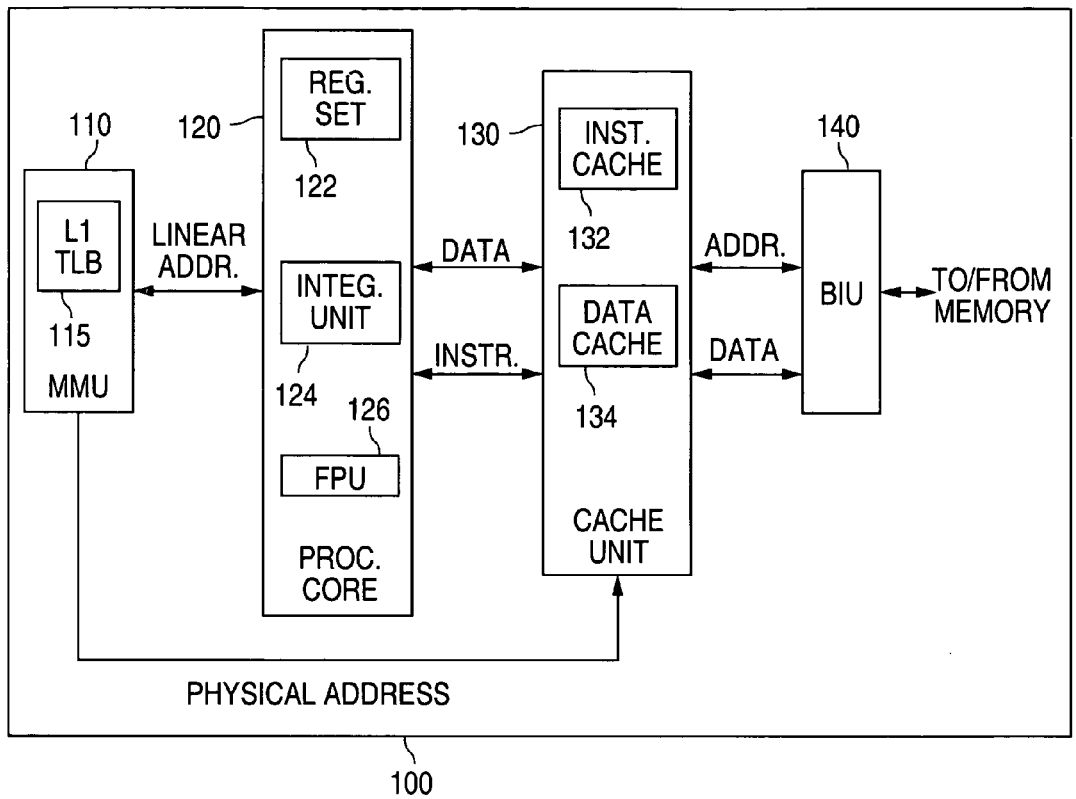
FIG. 1 illustrates an exemplary data processor comprising a cache memory containing a built-in self-test (BIST) circuit according to the principles of the present invention.

FIG. 1 illustrates selected portions of exemplary data processor 100, which comprises a cache memory containing a built-in self-test (BIST) circuit according to the principles of the present invention. Data processor 100 comprises memory management unit (MMU) 110, processor core 120, cache unit 130, and bus interface unit 140. MMU 110 contains Level 1 translation look-aside buffer (L1 TLB) 115. Processor core 120 comprises register set 122, integer unit 124, and floating point unit (FPU) 126. Cache unit 130 comprises instruction cache 132 and data cache 134. It should be understood that other forms of data processor 100 may be utilized and other modifications can be made without departing from the scope and spirit of the present invention.

According to an exemplary embodiment or the present invention, integer unit 124 in processor core 120 is a super-pipelined integer unit. Instruction cache 132 stores the most recently used instruction codes and data cache 134 stores the most recently used data. In alternate embodiment of the present invention, MMU 110 may comprise two translation look-aside buffers (TLBs), including an L1 TLB that may be direct mapped and a Level 2 (L2) TLB that may be n-way associative.

MMU 110 translates linear (or logical) addresses supplied by instruction unit 124 in processor core 120 into physical addresses (including addresses based on paging) for use by cache unit 130 and for transmission through BIU 140. Memory management procedures are preferably x86 compatible, adhering to standard paging mechanisms. Bus interface unit (BIU) 140 provides the main bus interface to memory (not shown). During a memory cycle, a memory location is selected through the Address lines and data is passed to/from memory through the Data lines.

Processor core 120 requests instructions from cache unit 130. The processing pipeline in pipelined integer unit 124 decodes the received integer instructions. If an instruction is a multimedia extension or FPU instruction, the instruction is passed to FPU 126 for processing. As required, data is fetched from data cache 134. If the requested data is not in data cache 134, the data is accessed via BIU 140 from either an L2 cache (not shown) or system memory (not shown).

According to an exemplary embodiment of data processor 100, built-in self-test (BIST) circuits may be used to test and validate the operation of instruction cache 132 or data cache 134, or both. In accordance with the principles of the present invention, the BIST circuits perform repetitive testing of the tag arrays and the comparator circuitry of instruction cache 132 and data cache 134.

Figure 2:
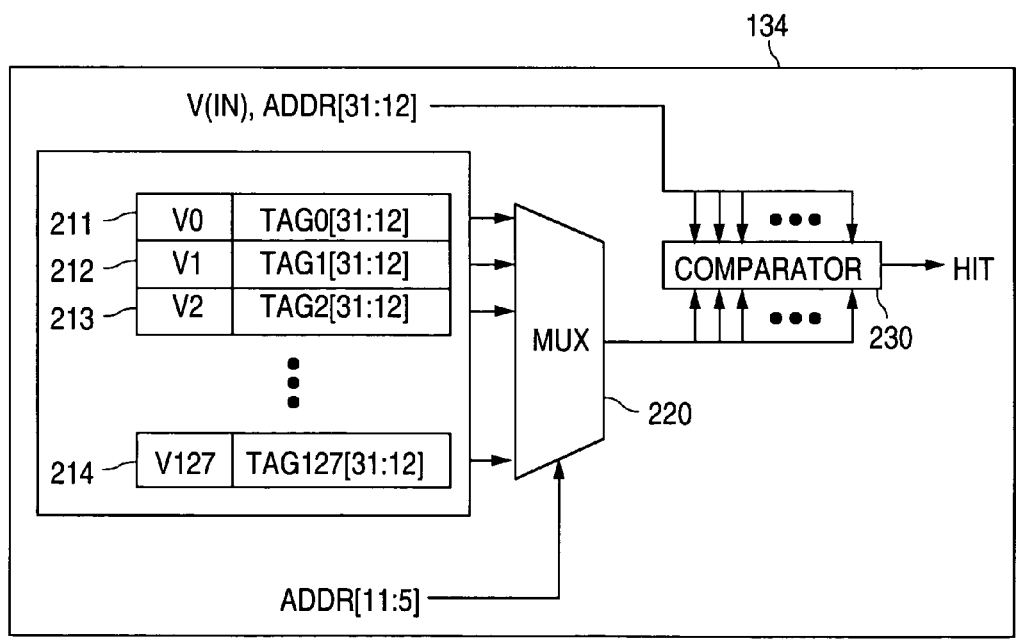
FIG. 2 illustrates an exemplary tag array of a cache memory containing a built-in self-test (BIST) circuit according to the principles of the present invention.

FIG. 2 illustrates selected portions of data cache 134, which contains a built-in self-test (BIST) circuit (shown in FIG. 3) according to the principles of the present invention. Those skilled in the art will appreciate that the description of data cache 134 that follows also applies to instruction cache 132, or any other type of cache memory (e.g., a Level 2 cache) that may be used in conjunction with data processor 100.

Data cache 134 comprises tag array 210, multiplexer (MUX) 220 and comparator 230. Those skilled in the art will understand that FIG. 2 illustrates only those portions of data cache 134 that are necessary to an understanding of the present invention and omits other portions that are not related to the present invention. For instance, FIG. 2 does not depict the data array of data cache 134, or other related circuitry. Also, the illustrated embodiment of data cache 134 contains only one tag array 210. Those skilled in the art will recognize that in an associative cache comprising N ways (e.g., 6 way cache), data cache 134 contains more than one tag array 134. However, illustrating and describing the testing of additional tag arrays and comparator logic would be highly repetitive and is unnecessary. It is sufficient to illustrate and describe the operation of the present invention with respect to only a single tag array 210.

In the illustrated embodiment, tag array 210 contains 128 entries, including exemplary tag entry 211 (i.e., Tag Entry 0), tag entry 212 (i.e., Tag Entry 1), tag entry 213 (i.e., Tag Entry 2) and tag entry 214 (i.e., Tag Entry 127). Each entry contains a valid bit (Vx) and a 20-bit tag value (TAGxx[31:12]).

For example, Tag Entry 0 comprises valid bit V0 and tag value TAG0[31:12], Tag Entry 1 comprises valid bit V1 and tag value TAG1[31:12], Tag Entry 2 comprises valid bit V2 and tag value TAG2[31:12], and Tag Entry 127 comprises valid bit V127 and tag value TAG127[31:12]. In alternate representation, the 20 bits in tag value TAGxx[31:12] may be represented as TAGxx[19:0].

As is well known, the lower order bits (e.g., ADDR[11:5]) of an address are used to access the upper bits (e.g., ADDR[31:12] of an address previously stored in a cache memory via MUX 220. To determine if the cache contains the data for a particular address, the tag array is checked for a matching tag entry. The lower part of the compare address, ADDR[11:5], is used to index into tag array 210 and MUX 220 selects one of the 128 tag entries. Comparator 230 compares the contents of the selected tag entry (i.e., Vx and TAGxx[31:12]) to V(IN)=1 and the upper bits of the compare address, ADDR[31:12]. If there is a match, comparator 230 enables the HIT signal (i.e., sets Hit to Logic 1). In other words, if the value of address bits [31:12] is xxx (decimal), where xxx is 000 to 128, then:

HIT=({VIN, ADDR[31:12]}={Vxx, TAGxx[31:12]})

Figure 3:
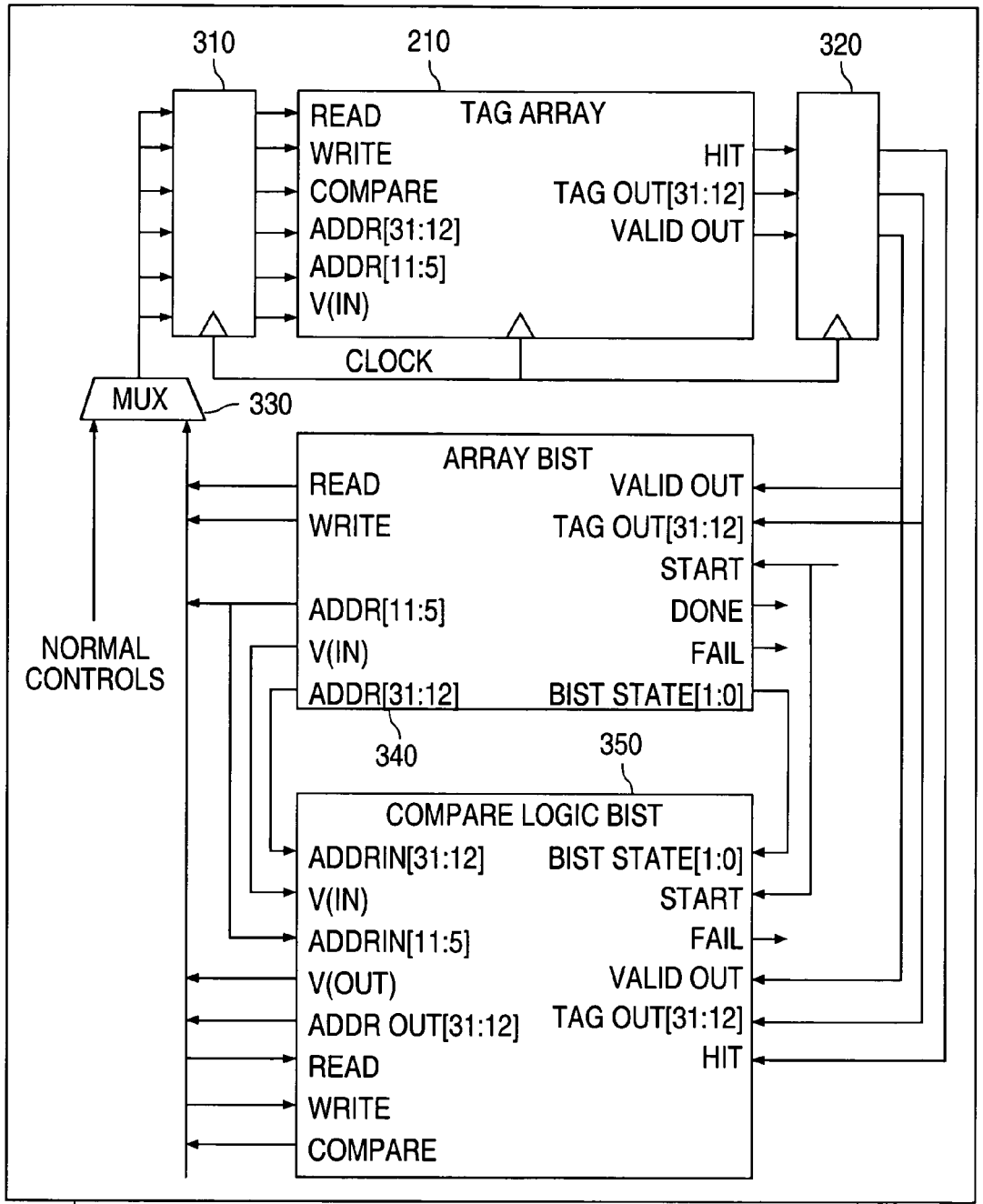
FIG. 3 illustrates an exemplary built-in self-test (BIST) circuit for testing the exemplary cache memory according to one embodiment of the present invention.

FIG. 3 illustrates an exemplary built-in self-test (BIST) circuit for testing data cache 134 according to one embodiment of the present invention. The BIST circuit comprises register 310, register 320, multiplexer (MUX) 330, array BIST circuit 340 and compare logic BIST circuit 350. According to an exemplary embodiment, BIST circuit 340 and compare logic BIST circuit 350 may comprise well-known types of microcontrollers, state machines, application specific integrated circuit (ASIC) devices, or the like, or combinations of two or more of such well-known circuits.

As FIG. 3 illustrates, registers 310 and 320 temporarily store data entering the inputs and exiting the outputs of tag array 210. In Normal mode, MUX 330 is selected such that the Normal Control signals are applied to register 310 and the inputs of tag array 210. However, in Test mode, MUX 330 is selected such that array BIST circuit 340 and compare logic BIST circuit 350 control tag array 210.

The control and data input signals of tag array 210 are the Read, Write and Compare control signals, upper address bits ADDR[31:12], lower address bits ADDR[11:5], valid bit V(IN), and a Clock signal. The control and data output signals of tag array 210 are the Hit signal, the Valid Out signal, and tag bits TAG OUT[31:12].

The control and data input signals of array BIST circuit 340 are the Start signal, the Valid Out signal, and tag bits TAG OUT[31:12]. The control and data output signals of array BIST circuit 340 are the Read, Write, Done and Fail control signals, control bits BIST State[1:0], address bits ADDR[31:12], address bits ADDR[11:5], and valid bit V(IN).

The control and data input signals of compare logic BIST circuit 350 are the Read, Write, Hit and Start control signals, the Valid Out signal, tag bits TAG OUT[31:12], control bits BIST State[1:0], address bits ADDR IN[31:12], address bits ADDR IN[11:5], and valid bit V(IN). The control and data output signals of compare logic BIST circuit 350 are the Compare and Fail control signals, address bits ADDR OUT [31:12], and valid bit V(OUT).

To test tag array 210, array BIST circuit 340 and compare logic BIST circuit 350 read and write various patterns to each location in tag array 210 according to well-known testing principles. These patterns are walking checkerboards (i.e., 1010 . . . 1010), walking inverted checkerboards (i.e., 0101 . . . 0101), walking ones (i.e., 1111 . . . 1111) and walking zeros (i.e., 0000 . . . 0000). It should be noted that during Test mode, the valid bits in tag array 210 are treated as just another data bit as patterns are written into and read from tag array 210.

During Test mode, the COMPARE control input is set to 0. This setting prevents tag array 210 from enabling comparator 230 and generating a HIT signal. It should be noted that a tag compare operation may be done in parallel with a tag array read operation.

Figure 4:
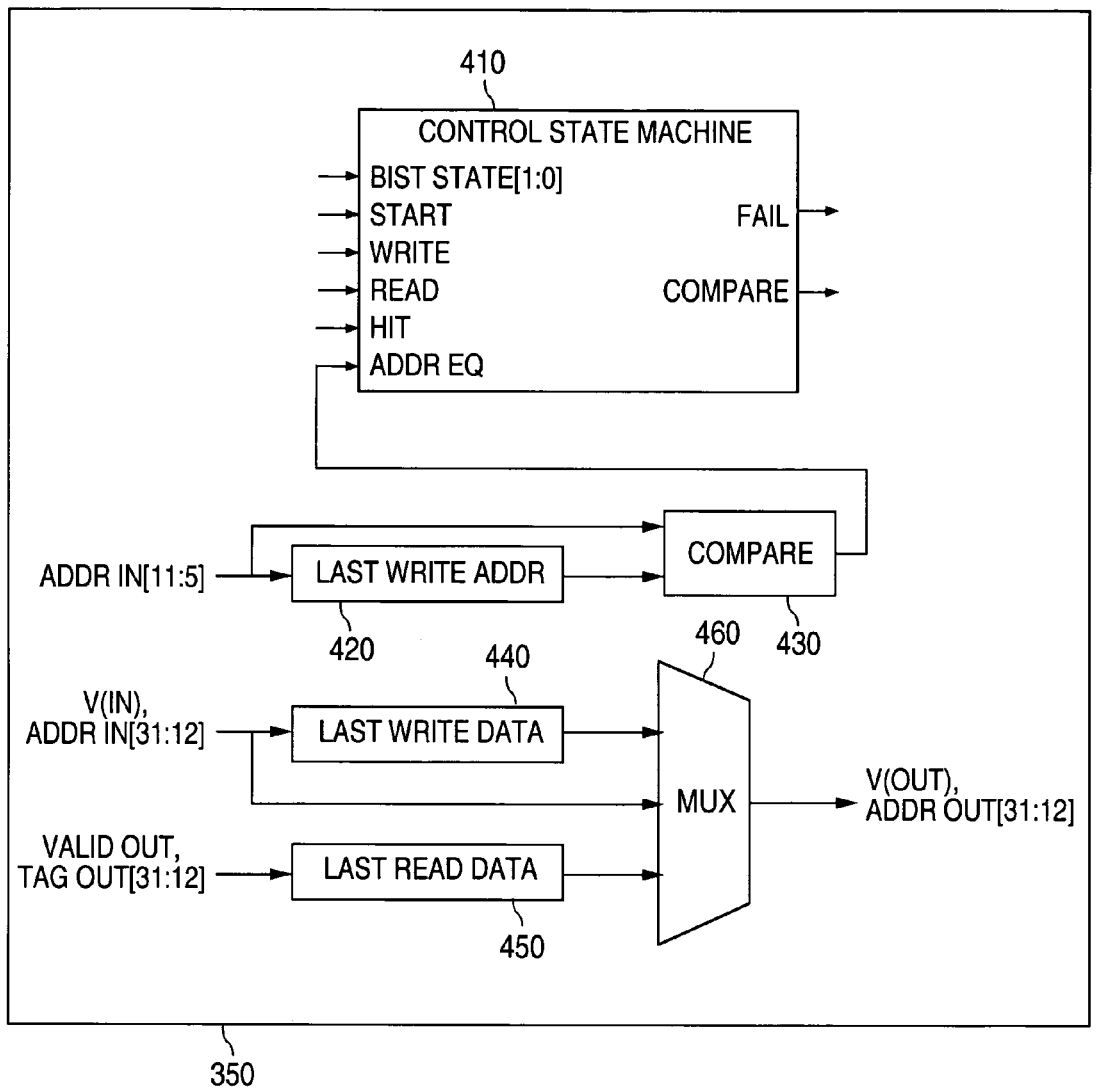
FIG. 4 illustrates the exemplary built-in self-test (BIST) circuit in greater detail to one embodiment of the present invention.

FIG. 4 illustrates selected portions of compare logic built-in self-test (BIST) circuit 350 in greater detail according to an exemplary embodiment of the present invention. Compare logic BIST circuit 350 comprises control state machine 410, Last Write Address register 420, comparator 430, Last Write Data register 440, Last Read Data register 450, and multiplexer (MUX) 460.

Control state machine 410 is a state machine that receives the Read, Write, Hit and Start control signals, and the control bits BIST State[1:0] from external sources. Control state machine 410 also receives the ADDR EQ signal from comparator 430. From these inputs control state machine 410 generates the Fail and Compare control signals.

The address bits ADDR IN[11:5] are inputs to Last Write Address register 420 and to one input channel of comparator 430. The other input channel of comparator 430 receives the last-written address bits ADDR IN[11:5] from Last Write Address register 420. Comparator 430 enables the ADDR EQ signal if the current value of ADDR IN[11:5] is equal to the last written value of ADDR IN[11:5] stored in Last Write Address 420.

The address bits ADDR IN[31:12] are inputs to Last Write Data register 440 and to one input channel of MUX 460. A second input channel of MUX 460 receives the last-written data bits ADDR IN[31:12] from Last Write Data register 430. The Valid Out control signal and the data bits TAG OUT[31:12] are inputs to Last Read Data register 450. A third input channel of MUX 460 receives the last-read value of the Valid Out signal and the last read data bits TAG OUT[31:12] from Last Read Data register 450.

During Test mode, when various test patterns are written and read from tag array 210, control state machine 410 keeps track of what was last written and last read from a tag entry in tag array 210 and applies the appropriate values for VIN, ADDR[31:12], and the Compare signal to tag array 210 to generate a tag comparison. Based on which pattern tests are currently being done, compare logic BIST circuit 350 expects HIT to be a 1 or 0, accordingly.

The control bits BIST State[1:0] indicate which test patterns are being used in testing tag array 210. According to an exemplary embodiment of the present invention, BIST State[1:0] control bits may have the following meanings:

| BIST State [1:0] | Test Pattern |
| --- | --- |
| 00 | Marching Checker Board |
| 01 | Marching Inverted Checker Board |
| 10 | Marching Ones |
| 11 | Marching Zeros |

During the testing of tag array 210, marching patterns are written and read to each tag entry location in tag array 210. For each tag entry in tag array 210, multiple writes and reads are performed until the marching pattern has filled the tag entry.

During the Marching Checker Board patterns, the last written address and the last written data are saved in Last Write Address register 420 and Last Write Data register 440, respectively. When a read operation is done, the address of the read (i.e., ADDR IN[11:5] is compared to the last write address (i.e., ADDR IN[11:5] stored in Last Write Address register 420) by comparator 430 and if they are equal (i.e., ADDR EQ is enabled), the last written data stored in Last Write Data 440 (i.e., V(IN) and ADDR IN[31:12] are output at VOUT and ADDR OUT[31:12] via MUX 460 and are applied to tag array 210 for comparison to the contents of tag array 210. In this situation, a HIT=1 is expected.

During the Marching Ones or Zeroes patterns, the last read data and the last write address are saved in Last Read Data register 450 and Last Write Address register 420. On the next read from the same address as the write operation, the last read data is applied to VOUT and ADDR OUT[31:12] for comparison to the entry in tag array 210. There should only be a 1-bit difference between the last read data and the current read data and, therefore, the HIT output should be 0. Control state machine 410 keeps track of when HIT should be 1 and when HIT should be 0. If the value of HIT is incorrect, then the Fail control signal is enabled.

Although the present invention has been described with an exemplary embodiment, various changes and modifications may be suggested to one skilled in the art. It is intended that the present invention encompass such changes and modifications as fall within the scope of the appended claims.

What is claimed is:

1. A cache memory comprising:
   a tag array comprising a plurality of tag entry locations, each of said tag entry locations capable of being accessed by R of the M least significant bits of an N-bit received address and capable storing an address tag comprising the (N-M) most significant bits of said N-bit received address;
   cache hit comparison circuitry capable of comparing the (N-M) most significant bits of an N-bit received address with an address tag accessed by R of the M least significant bits of said N-bit received address and generating a HIT signal if a match occurs; and
   tag array test circuitry capable of:
      storing a copy of the last data written to said tag array;
      storing an address of a tag entry location to which data was last written;
      storing a copy of the last data read from said tag array; and
      determining if R of the M least significant bits of a current received address are equal to R of the M least significant bits of said stored address of said tag entry location to which data was last written.

2. The cache memory as set forth in claim 1 wherein said tag array test circuitry, in response to a determination that R of the M least significant bits of a current received address are equal to R of the M least significant bits of said stored address of said tag entry location to which data was last written, is further capable of comparing said stored copy of the last data written to said tag array with data retrieved from said tag array at said current received address.

3. The cache memory as set forth in claim 2 wherein said tag array test circuitry compares said stored copy of the last data written to said tag array with said data retrieved from said tag array at said current received address by determining if said HIT signal is enabled.

4. The cache memory as set forth in claim 1 wherein said tag array test circuitry, in response to a determination that R of the M least significant bits of a current received address are equal to R of the M least significant bits of said stored address of said tag entry location to which data was last written, is further capable of comparing said stored copy of the last data read from said tag array at said current received address with current data read from said tag array at said current received address.

5. The cache memory as set forth in claim 4 wherein said tag array test circuitry compares said stored copy of the last data read from said tag array at said current received address with said current data read from said tag array at said current received address by determining if said HIT signal is enabled.

6. A data processor comprising:
   processor core logic comprising at least one of an integer unit and a floating point unit for executing instructions;
   a cache memory associated with said processor core logic comprising:
   a tag array comprising a plurality of tag entry locations, each of said tag entry locations capable of being accessed by R of the M least significant bits of an N-bit received address and capable storing an address tag comprising the (N-M) most significant bits of said N-bit received address;
   cache hit comparison circuitry capable of comparing the (N-M) most significant bits of an N-bit received address with a tag address accessed by R of the M least significant bits of said N-bit received address and generating a HIT signal if a match occurs; and
   tag array test circuitry capable of:
      storing a copy of the last data written to said tag array;
      storing an address of a tar entry location to which data was last written;
      storing a copy of the last data read from said tag array; and
      determining if R of the M least significant bits of a current received address are equal to R of the M least significant bits of said stored address of said tar entry location to which data was last written.

7. The data processor as set forth in claim 6 wherein said tag array test circuitry, in response to a determination that R of the M least significant bits of a current received address are equal to R of the M least significant bits of said stored address of said tag entry location to which data was last written, is further capable of comparing said stored copy of the last data written to said tag array with data retrieved from said tag array at said current received address.

8. The data processor as set forth in claim 7 wherein said tag array test circuitry compares said stored copy of the last data written to said tag array with said data retrieved from said tag array at said current received address by determining if said HIT signal is enabled.

9. The data processor as set forth in claim 6 wherein said tag array test circuitry, in response to a determination that R of the M least significant bits of a current received address are equal to R of the M least significant bits of said stored address of said tag entry location to which data was last written, is further capable of comparing said stored copy of the last data read from said tag array at said current received address with current data read from said tag array at said current received address.

10. The data processor as set forth in claim 9 wherein said tag array test circuitry compares said stored copy of the last data read from said tag array at said current received address with said current data read from said tag array at said current received address by determining if said HIT signal is enabled.

11. For use in a cache memory comprising: 1) a tag array comprising a plurality of tag entry locations that are accessed by R of the M least significant bits of an N-bit received address and that store an address tag comprising the (N-M) most significant bits of the N-bit received address; and 2) cache bit comparison circuitry for comparing the (N-M) most significant bits of an N-bit received address with a tag address accessed by R of the M least significant bits of the N-bit received address and generating a HIT signal if a match occurs, a method of testing the operation of the tag array and the cache hit comparison circuitry comprising:

storing: i) a copy of the last data written to the tag array, ii) a copy of the last data read from the tag array, and iii) an address of a tag entry location to which data was last written; and determining if R of the M least significant bits of a current received address are equal to R of the M least significant bits of the stored address of the tag entry location to which data was last written.

12. The method as set forth in claim 11 further comprising, in response to a determination that R of the M least significant bits of a current received address are equal to R of the M least significant bits of the stored address of the tag entry location to which data was last written, comparing the stored copy of the last data written to the tag array with data retrieved from the tag array at the current received address.

13. The method as set forth in claim 12 wherein comparing the tag array test circuitry comprises comparing the stored copy of the last data written to the tag array with the data retrieved from the tag array at the current received address by determining if the HT signal is enabled.

14. The method as set forth in claim 13 further comprising, in response to a determination that R of the M least significant bits of a current received address are equal to R of the M least significant bits of the stored address of the tag entry location to which data was last written, comparing the stored copy of the last data read from the tag array at the current received address with current data read form the tag array at the current received address.

15. The method as set forth in claim 14 wherein comparing the stored copy comprises comparing the stored copy of the last data read from the tag array at the current received address with the current data read from the tag array at the current received address by determining if the HIT signal is enabled.

* * * * *

UNITED STATES PATENT AND TRADEMARK OFFICE
CERTIFICATE OF CORRECTION

PATENT NO.        : 6,968,427 B1
APPLICATION NO. : 10/308913
DATED             : November 22, 2005
INVENTOR(S)       : Daniel E. Yee It is certified that error appears in the above-identified patent and that said Letters Patent is hereby corrected as shown below:

Column 8, line 22:  Please change "a tar entry" to "a tag entry"

Column 8, line 28:  Please change "said tar entry" to "said tag entry"

Column 8, line 64:  Please change "cache bit comparison" to "cache hit comparison"

Column 10, line 3:  Please change "the HT signal" to "the HIT signal"

Signed and Sealed this

Eighth Day of August, 2006

JON W. DUDAS
*Director of the United States Patent and Trademark Office*